(12) United States Patent
Sambongi et al.

(10) Patent No.: US 9,571,728 B2
(45) Date of Patent: Feb. 14, 2017

(54) IMAGE ACQUISITION APPARATUS

(71) Applicant: OLYMPUS CORPORATION, Shibuya-ku, Tokyo (JP)

(72) Inventors: Masao Sambongi, Tokyo (JP); Ikutoshi Fukushima, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 180 days.

(21) Appl. No.: 14/281,633

(22) Filed: May 19, 2014

(65) Prior Publication Data

US 2015/0009351 A1 Jan. 8, 2015

(30) Foreign Application Priority Data

Jul. 4, 2013 (JP) .................... 2013-140821

(51) Int. Cl.
  *H04N 5/232* (2006.01)
  *H01L 27/146* (2006.01)
(52) U.S. Cl.
  CPC .... *H04N 5/23229* (2013.01); *H01L 27/14627* (2013.01)
(58) Field of Classification Search
  CPC .............. H04N 5/23229; H01L 27/14627
  See application file for complete search history.

(56) References Cited

U.S. PATENT DOCUMENTS

| | | | |
|---|---|---|---|
| 5,602,584 A | 2/1997 | Mitsutake et al. | |
| 8,605,197 B2 | 12/2013 | Ono | |
| 8,913,837 B2 | 12/2014 | Aoki | |
| 8,964,110 B2 | 2/2015 | Ono | |
| 2007/0279618 A1* | 12/2007 | Sano | G06T 5/003 356/72 |
| 2009/0102956 A1* | 4/2009 | Georgiev | H04N 5/23212 348/315 |

(Continued)

FOREIGN PATENT DOCUMENTS

| | | |
|---|---|---|
| EP | 2624540 A1 | 8/2013 |
| JP | 04042207 A | 2/1992 |

(Continued)

OTHER PUBLICATIONS

Japanese Office Action (and English translation thereof) dated Jul. 28, 2015, issued in counterpart Japanese Application No. 2013-140821.

(Continued)

*Primary Examiner* — Jason Flohre
(74) *Attorney, Agent, or Firm* — Holtz, Holtz & Volek PC

(57) ABSTRACT

A stable combined image is generated from a plurality of image signals having parallax and obtained at different focal positions. An image acquisition apparatus includes an image-acquisition optical system that collects light from a subject; an image acquisition element that acquires an image of the light collected by the image-acquisition optical system; a micro-lens array having an array of multiple micro-lenses arranged such that each micro-lens covers multiple pixels of the image acquisition element; and a focal-length changing section that is disposed at a pupil position of the image-acquisition optical system and that spatially changes a focal length so as to focus light passing therethrough at a plurality of different focal positions.

16 Claims, 12 Drawing Sheets

(56) References Cited

U.S. PATENT DOCUMENTS

| | | | |
|---|---|---|---|
| 2009/0190022 A1* | 7/2009 | Ichimura | H04N 5/2254 348/340 |
| 2010/0085468 A1* | 4/2010 | Park | H04N 5/23296 348/345 |
| 2010/0141802 A1* | 6/2010 | Knight | H04N 5/2252 348/240.3 |
| 2011/0242342 A1* | 10/2011 | Goma | H04N 5/232 348/218.1 |
| 2012/0050512 A1 | 3/2012 | Ono | |
| 2012/0229682 A1* | 9/2012 | Ng | H04N 9/646 348/241 |
| 2013/0222676 A1* | 8/2013 | Ono | H04N 5/2254 348/345 |
| 2013/0223759 A1* | 8/2013 | Nishiyama | H04N 5/23232 382/284 |
| 2013/0329042 A1* | 12/2013 | Murata | H04N 5/2254 348/140 |
| 2013/0342753 A1* | 12/2013 | Kitagawa | H04N 5/23212 348/349 |

FOREIGN PATENT DOCUMENTS

| | | |
|---|---|---|
| JP | 06141237 A | 5/1994 |
| JP | 2000152281 A | 5/2000 |
| JP | 2005020718 A | 1/2005 |
| JP | 2007158825 A | 6/2007 |
| JP | 2007306406 A | 11/2007 |
| JP | 2011147079 A | 7/2011 |
| JP | 2011215811 A | 10/2011 |
| JP | 2012-045053 A | 3/2012 |
| JP | 2012195797 A | 10/2012 |
| JP | 2013073306 A | 4/2013 |
| WO | 2012043211 A1 | 4/2012 |
| WO | 2013080821 A1 | 6/2013 |

OTHER PUBLICATIONS

Japanese Office Action (and machine English translation thereof) dated Nov. 4, 2015, issued in counterpart Japanese Application No. 2013-140821.

* cited by examiner (b)

(a)

(a)

(b)

IMAGE ACQUISITION APPARATUS

CROSS-REFERENCE TO RELATED APPLICATION

This application is based on Japanese Patent Application No. 2013-140821, the contents of which are incorporated herein by reference.

TECHNICAL FIELD

The present invention relates to image acquisition apparatuses.

BACKGROUND ART

A known image acquisition apparatus in the related art acquires multiple images at different focal lengths by using two image acquisition sections with different optical axes and different focal positions and combines the acquired images (for example, see Patent Literature (PTL) 1).

The image acquisition apparatus in Patent Literature 1 varies the image acquisition timings of the two image acquisition sections so as to reduce a parallax shift.

CITATION LIST

Patent Literature

{PTL 1}
Japanese Unexamined Patent Application, Publication No. 2012-45053

SUMMARY OF INVENTION

Technical Problem

Since images are acquired at different image acquisition timings while the two image acquisition sections are moved relatively to a subject, if the subject moves significantly or moves anomalously, a positional deviation occurs between the images acquired by the image acquisition sections, thus making it difficult to perform a stable image combining process.

The present invention is an image acquisition apparatus that can generate a stable combined image from multiple image signals having parallax and obtained at different focal positions.

Solution to Problem

An aspect of the invention is an image acquisition apparatus including an image-acquisition optical system that collects light from a subject; an image acquisition element that acquires an image of the light collected by the image-acquisition optical system; a micro-lens array having an array of multiple micro-lenses arranged such that each micro-lens covers multiple pixels of the image acquisition element; and a focal-length changing section that is disposed at a pupil position of the image-acquisition optical system and that spatially changes a focal length so as to focus light passing therethrough at a plurality of different focal positions.

According to this aspect, the light from the subject, which has parallax and is collected by the image-acquisition optical system, travels through the focal-length changing section where the focal length is spatially changed so that the light is focused at the plurality of focal positions. Then, each micro-lens of the micro-lens array causes the light to be incident on the multiple pixels covered by the micro-lens. Specifically, light beams having parallax and emitted from different positions of the subject in the depth direction thereof are focused onto different pixels by each micro-lens.

Accordingly, by collecting image signals from pixels onto which light beams emitted from similar depth positions are focused, a plurality of images at different focal positions can be generated.

In this case, according to this aspect, since a plurality of images are generated from image signals acquired at the same image acquisition timing, a stable combined image can be generated even when the subject moves.

In the above aspect, the image acquisition element may include an image generator that extracts signals from the pixels receiving light beams of a common focal length for each micro-lens so as to generate a plurality of image signals, a position aligner that positionally aligns the plurality of image signals generated by the image generator, and an image combiner that generates a combined image by combining the plurality of image signals positionally aligned relatively to each other by the position aligner.

Accordingly, the image generator generates a plurality of image signals from the signal acquired by the image acquisition element, the position aligner performs a positional alignment process, and the image combiner generates a combined image. Since simultaneously-acquired images having parallax and obtained at different focal positions are combined, a stable combined image of a moving subject can be acquired.

Furthermore, another aspect of the invention is an image acquisition apparatus including an image acquisition element that acquires an image of light from a subject; an image-acquisition optical system that causes light beams that form images having parallax and obtained at different focal positions to be incident on different areas of the image acquisition element; a position aligner that positionally aligns a plurality of image signals acquired at the different areas of the image acquisition element; and an image combiner that generates a combined image by combining the plurality of image signals positionally aligned relatively to each other by the position aligner.

According to this aspect, the image-acquisition optical system causes the light from the subject to be incident on different areas of the image acquisition element as light beams that form images having parallax and obtained at different focal positions. Then, the plurality of image signals acquired at the different areas of the image acquisition element are positionally aligned by the position aligner, and the image combiner subsequently generates a combined image. Since simultaneously-acquired images having parallax and obtained at different focal positions are combined, a stable combined image of a moving subject can be acquired.

In the above aspect, the image-acquisition optical system may include an image acquisition lens that collects the light from the subject, and two or more pupil-division optical systems having different focal lengths, which are disposed between the image acquisition lens and the image acquisition element and split and receive the light collected by the image acquisition lens.

Furthermore, in the above aspect, the aforementioned optical system may include two or more micro-optical systems having different focal lengths, which have different optical axes and are arranged in parallel at positions where the light from the subject is received.

Furthermore, in the above aspect, the position aligner may include a local-region setting section that sets a local region formed of multiple pixels centered on a reference pixel for each of the plurality of image signals, a frequency adjuster that adjusts frequency components of the local regions set for the respective image signals by the local-region setting section to a common frequency component, a matching section that performs a matching process between the local regions of the image signals whose frequency components have been adjusted by the frequency adjuster, and an image deforming section that deforms the plurality of image signals based on a result of the matching process performed by the matching section.

Accordingly, when the position aligner positionally aligns the image signals, the local-region setting section sets a local region formed of multiple pixels for each image signal, the frequency adjuster adjusts the frequency components of the local regions to a common frequency component, and the matching section subsequently performs a matching process between the local regions. Since light beams having parallax and obtained at different focal positions are focused onto different areas of the image acquisition element, the adjustment of the frequency components to a common frequency component facilitates the matching process performed by the matching section. Furthermore, since corresponding points between the plurality of image signals are detected as the result of the matching process, the image signals are deformed in accordance with coordinate transformation using the corresponding points, whereby the positional alignment of the plurality of image signals can be performed with high accuracy.

Furthermore, in the above aspect, the image combiner may include an evaluation-value calculator that calculates, for each pixel, an evaluation value required for determining whether the plurality of image signals are in focus, a combining-mask generator that generates a combining mask for combining the image signals by using the evaluation values calculated by the evaluation-value calculator, and an adding section that performs a weighting-adding process on the plurality of image signals on a pixel-by-pixel basis by using the combining mask generated by the combining-mask generator.

Accordingly, the combining-mask generator generates the combining mask by using the evaluation values required for in-focus determination calculated by the evaluation-value calculator, and the adding section performs the weighting-adding process on the plurality of image signals by using the combining mask. Consequently, a combined image formed by combining the plurality of image signals is generated based on a ratio according to the in-focus states of the image signals.

Furthermore, in the above aspect, the frequency adjuster may include a comparing section that compares the frequency components of the local regions corresponding to the plurality of image signals, and a filter processor that applies a filter generated based on a comparison result obtained by the comparing section to the local regions corresponding to the plurality of image signals.

Accordingly, a filter having a filter coefficient according to a difference between frequency components is generated based on the comparison result obtained by the comparing section, and a filtering process is performed by using the generated filter, whereby the frequency components of the local regions corresponding to the plurality of image signals can be easily adjusted to a common frequency component.

Furthermore, in the above aspect, the position aligner may include a search-range setting section that sets a search range for the local regions corresponding to the plurality of image signals in accordance with a distance from an optical axis of the optical system. The matching section may search for the local regions based on the search range set by the search-range setting section and perform the matching process by using the searched local regions.

Accordingly, the matching process can be performed quickly by searching for local regions efficiently without having to search for local regions over a wide range.

Furthermore, in the above aspect, the comparing section may include a difference calculator that calculates a difference between the frequency components of the local regions corresponding to the plurality of image signals, and a determiner that determines whether or not the difference calculated by the difference calculator is larger than a predetermined threshold value. The filter generator may generate the filter used for only extracting frequency components whose difference therebetween is determined as being smaller than or equal to the threshold value by the determiner.

Accordingly, the difference calculator calculates the difference between the frequency components of the local regions corresponding to the plurality of image signals, and the determiner determines whether or not the difference is large. Then, the filter generator generates the filter used for only extracting frequency components that are closely analogous between corresponding local regions, so that the positional alignment process can be performed with high accuracy by only using signals of frequency components existing commonly in the plurality of image signals.

Furthermore, in the above aspect, the frequency adjuster may include a histogram calculator that calculates a histogram for the frequency components of the local regions corresponding to the plurality of image signals, a filter generator that generates a filter based on the histogram calculated by the histogram calculator, and a filter processor that applies the filter generated by the filter generator to the local regions corresponding to the plurality of image signals.

Accordingly, the comparison between frequency components of corresponding local regions can be performed easily in accordance with the histogram calculated by the histogram calculator, and the filter used for performing frequency adjustment can be more easily generated by the filter generator.

Advantageous Effects of Invention

The present invention is advantageous in that a stable combined image can be generated from a plurality of image signals having parallax and obtained at different focal positions.

DESCRIPTION OF EMBODIMENTS

An image acquisition apparatus 1 according to a first embodiment of the present invention will be described below with reference to the drawings.

Figure 1:
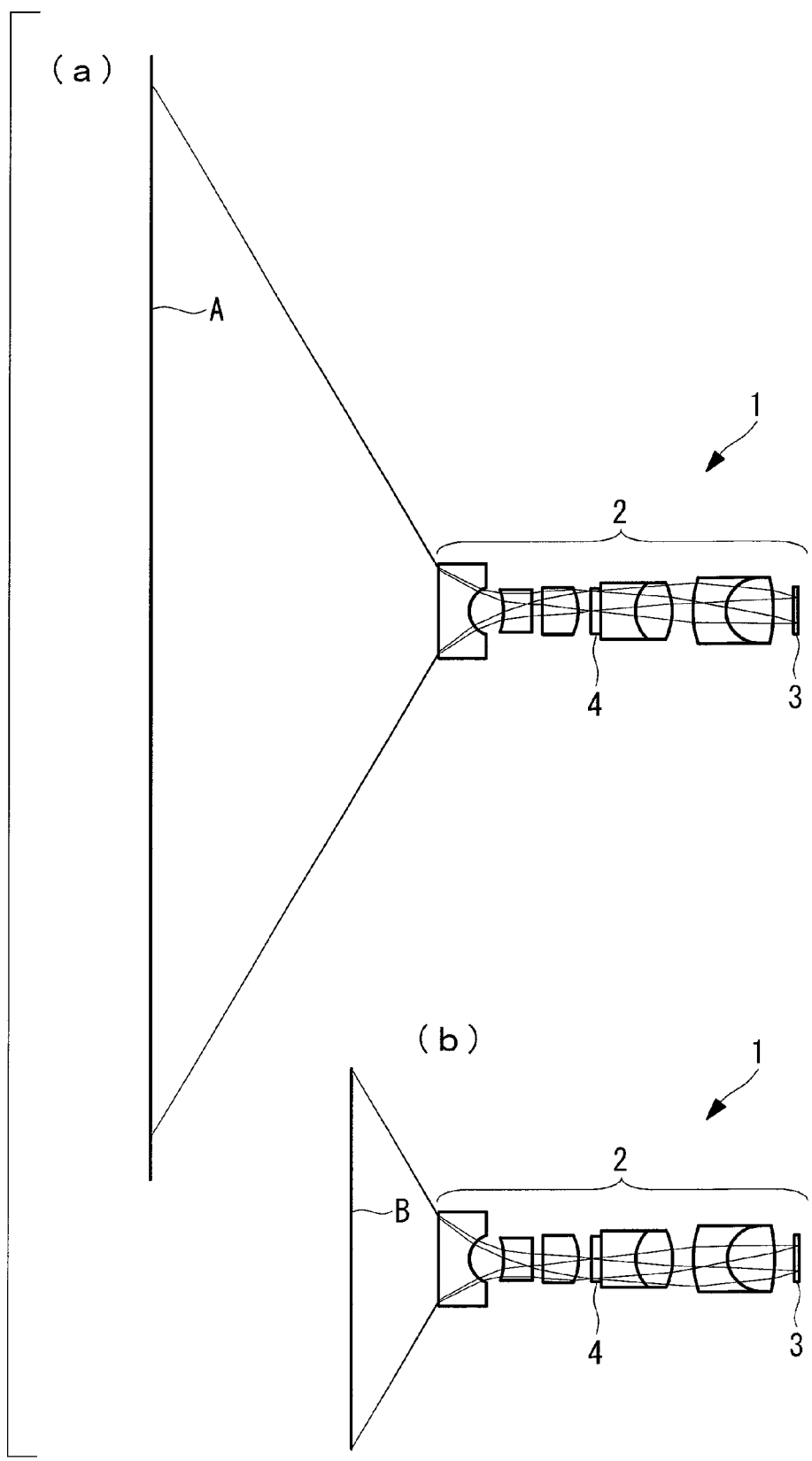
FIG. 1 illustrates the overall configuration of an image acquisition apparatus according to a first embodiment of the present invention and includes part (a) showing an optical path of light from a far position and part (b) showing an optical path of light from a near position.

As shown in FIGS. 1(a) and 1(b), the image acquisition apparatus 1 according to this embodiment includes an image-acquisition optical system 2 that collects light from a subject, an image acquisition section 3 that acquires an image of the light collected by the image-acquisition optical system 2, and a focal-length changing section 4 that is disposed at a pupil position of the image-acquisition optical system 2 and that spatially changes the focal length so as to focus light passing therethrough at a plurality of different focal positions.

Figure 2:
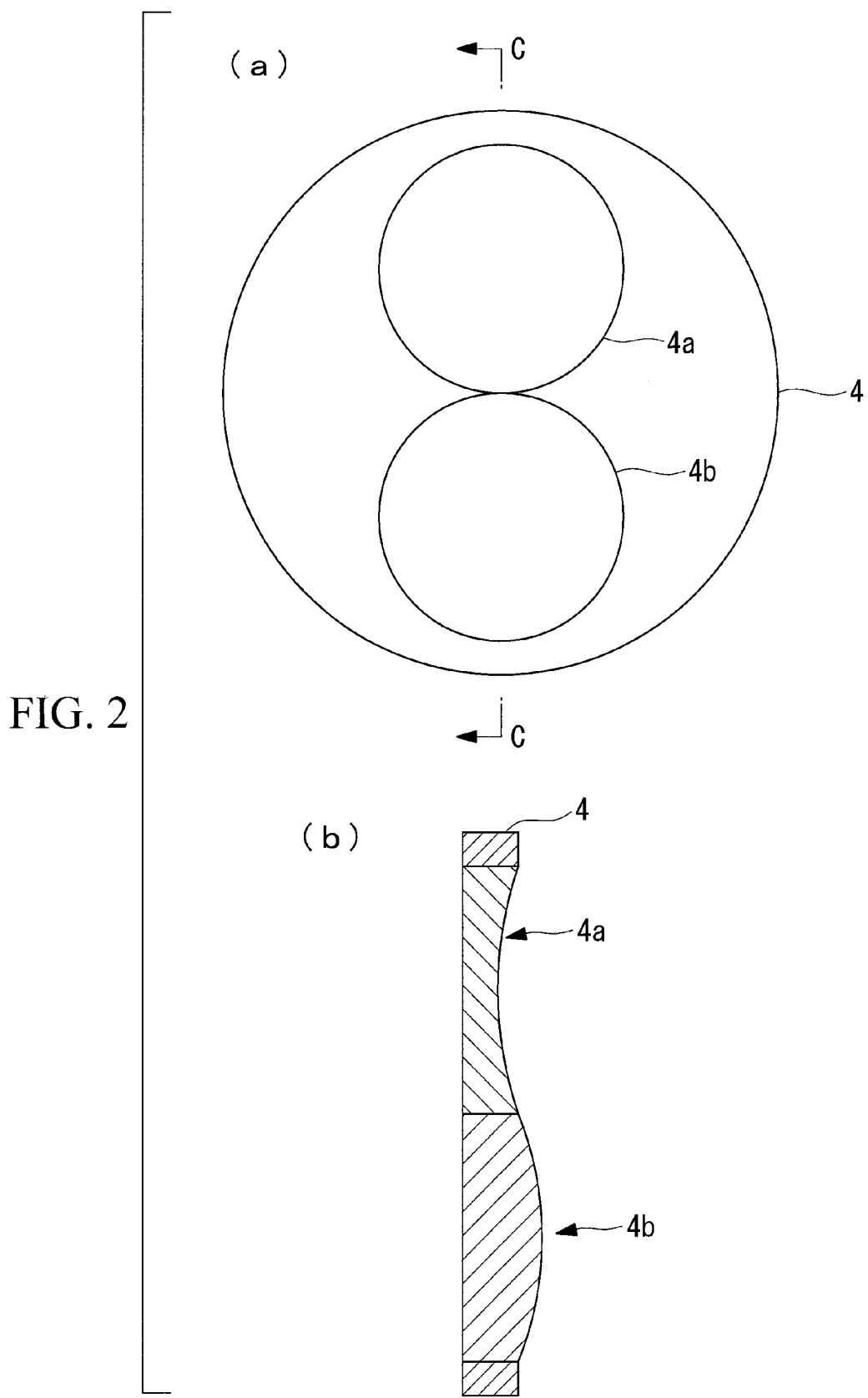
FIG. 2 includes a front view (a) and a cross-sectional view (b) taken along line C-C, illustrating an example of a focal-length changing section included in the image acquisition apparatus in FIG. 1.

As shown in FIGS. 2(a) and 2(b), the focal-length changing section 4 includes lenses 4a and 4b having different curvatures and is disposed at the pupil position of the image-acquisition optical system 2. The focal-length changing section 4 changes the light passing through the pupil position into two light beams with different focal positions in the optical-axis direction. Specifically, light emitted from a single point on the subject and collected by the image-acquisition optical system 2 passes through the pupil position so as to be changed into two kinds of light beams that are to be focused onto different positions in the optical-axis direction.

In other words, as shown in FIG. 1(a) and FIG. 1(b), one (A) of two light beams emitted from different depth positions A and B of the subject passes through the first lens 4a disposed at the pupil position so as to be focused onto the image acquisition section 3, whereas the other light beam (B) passes through the second lens 4b so as to be focused onto the same image acquisition section 3.

Figure 3:
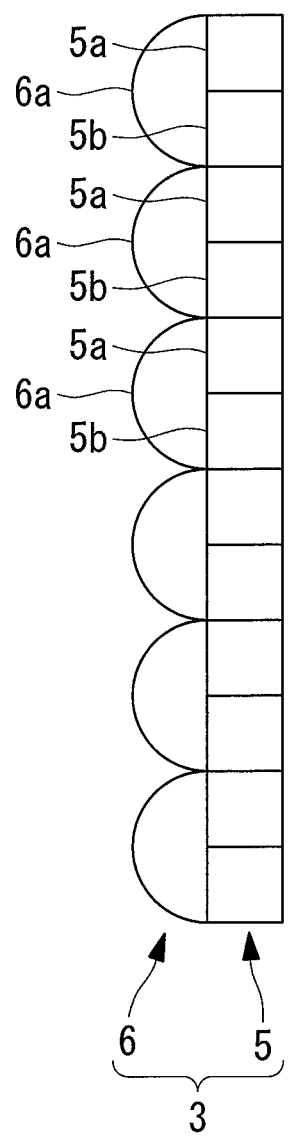
FIG. 3 illustrates an image acquisition section included in the image acquisition apparatus in FIG. 1.

As shown in FIG. 3, the image acquisition section 3 includes an image acquisition element 5, such as a CCD, formed of an array of multiple pixels 5a and 5b, and a micro-lens array 6 formed of an array of multiple micro-lenses 6a arranged at an image acquisition surface of the image acquisition element 5 such that each micro-lens 6a covers multiple pixels 5a and 5b (two pixels in FIG. 3). The direction in which the pixels 5a and 5b covered by each micro-lens 6a are arranged is aligned with the direction in which the lenses 4a and 4b in the focal-length changing section 4 are arranged.

The operation of the image acquisition apparatus 1 according to this embodiment having the above-described configuration will be described below.

In the image acquisition apparatus 1 according to this embodiment, of the light beams emitted from the subject, the light beam generated at the position A, which is relatively far from the image-acquisition optical system 2, is collected by the image-acquisition optical system 2 and passes through the lens 4a of the focal-length changing section 4 disposed at the pupil position. The light beam then travels through the remaining part of the image-acquisition optical system 2, is collected by the micro-lenses 6a, and is focused onto the image acquisition surface of the image acquisition element 5. Furthermore, of the light beams emitted from the subject, the light beam generated at the position B, which is relatively close to the image-acquisition optical system 2, is collected by the image-acquisition optical system 2 and passes through the lens 4b disposed at the pupil position. The light beam then travels through the remaining part of the image-acquisition optical system 2, is collected by the micro-lenses 6a, and is focused onto the image acquisition surface of the image acquisition element 5.

In this case, since the two kinds of light beams undergo pupil division due to passing through different areas of the pupil position, parallax occurs. Therefore, when the light beams enter the micro-lenses 6a, the light beams are focused onto different positions of the image acquisition element 5. Since each micro-lens 6a is provided so as to cover two pixels 5a and 5b, the two kinds of light beams are respectively focused onto different pixels 5a and 5b. As a result, images of two kinds of light beams having parallax and obtained at different focal positions can be simultaneously acquired by the image acquisition element 5.

By collecting signals output from the pixels receiving the light from similar focal positions of the subject, image signals of two images can be acquired. Therefore, by positionally aligning and combining these acquired images, an advantage is afforded in that a stable combined image of a moving subject can be acquired, as compared with an image acquisition apparatus in the related art that acquires images by varying the image acquisition timings.

Although two lenses 4a and 4b are disposed at the pupil position in this embodiment, the configuration is not limited thereto; a freely-chosen number of lenses may be disposed. In this case, the number of pixels 5a and 5b covered by each micro-lens 6a needs to be a multiple of the number of lenses 4a and 4b at the pupil position. For example, assuming that the number of lenses 4a and 4b at the pupil position is N, the number p of pixels 5a and 5b covered by each micro-lens 6a may satisfy the condition p=kN (k being an integer greater than or equal to 1).

Next, an image acquisition apparatus 10 according to a second embodiment of the present invention will be described below with reference to the drawings.

Figure 4:
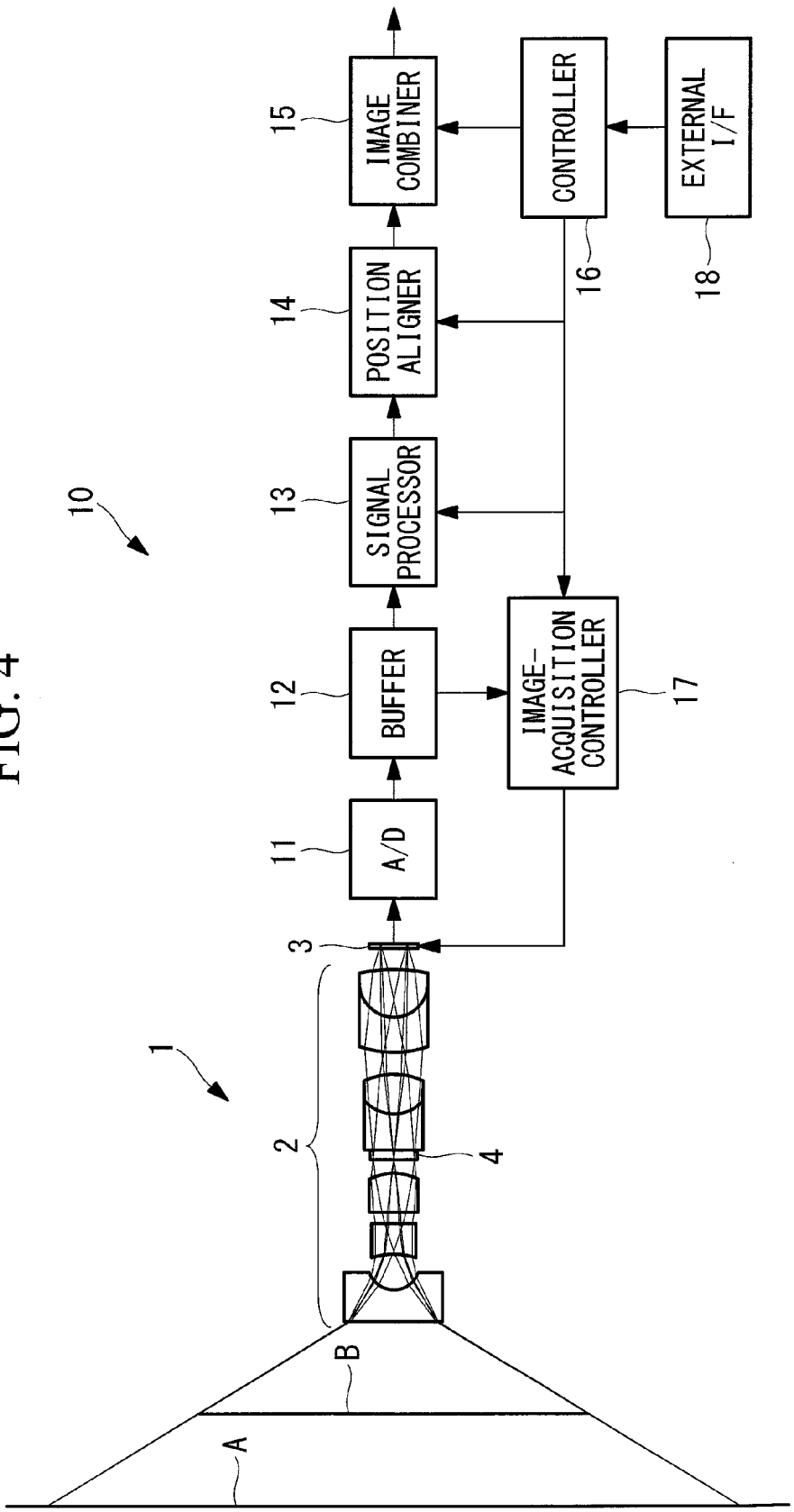
FIG. 4 illustrates the overall configuration of an image acquisition apparatus according to a second embodiment of the present invention.

As shown in FIG. 4, in addition to the image acquisition apparatus 1 according to the first embodiment, the image acquisition apparatus 10 according to this embodiment includes an A/D converter 11 that converts an image signal acquired by the image acquisition section 3 into a digital signal, a buffer 12 that stores the image signal converted into a digital signal by the A/D converter 11, a signal processor 13 that generates image signals of two images by processing the image signal transmitted from the buffer 12, a position aligner 14 that positionally aligns the two image signals generated at the signal processor 13, an image combiner 15 that combines the two images positionally aligned at the position aligner 14, and a controller 16 that controls these components.

Reference numeral 17 in the drawing denotes an image-acquisition controller that controls, for example, the electronic shutter speed of the image acquisition element 5 or a lens stop (not shown) for adjusting the level of incident light on the basis of the image signal stored in the buffer 12 by using the brightness level in the image signal or a brightness sensor (not shown).

Reference numeral 18 denotes an external I/F that includes, for example, a shutter button operable by an operator. For example, when the shutter button is pressed halfway, the mode switches to a pre-shooting mode in which the image-acquisition controller 17 controls the image acquisition element 5 and so on. When the shutter button is fully pressed, the mode switches to a main shooting mode in which a subject is photographed on the basis of exposure conditions set by the image-acquisition controller 17.

The signal processor 13 is configured to extract image signals of two images from the image signal stored in the buffer 12. In the image acquisition apparatus 1 according to the first embodiment, each micro-lens 6a covers two pixels 5a and 5b, and images of two kinds of light beams having parallax and obtained at different focal positions are simultaneously acquired by different pixels 5a and 5b. Therefore, by extracting only the signals from the identical types of pixels 5a and 5b, two kinds of image signals having parallax and obtained at different focal positions can be generated.

Figure 5:
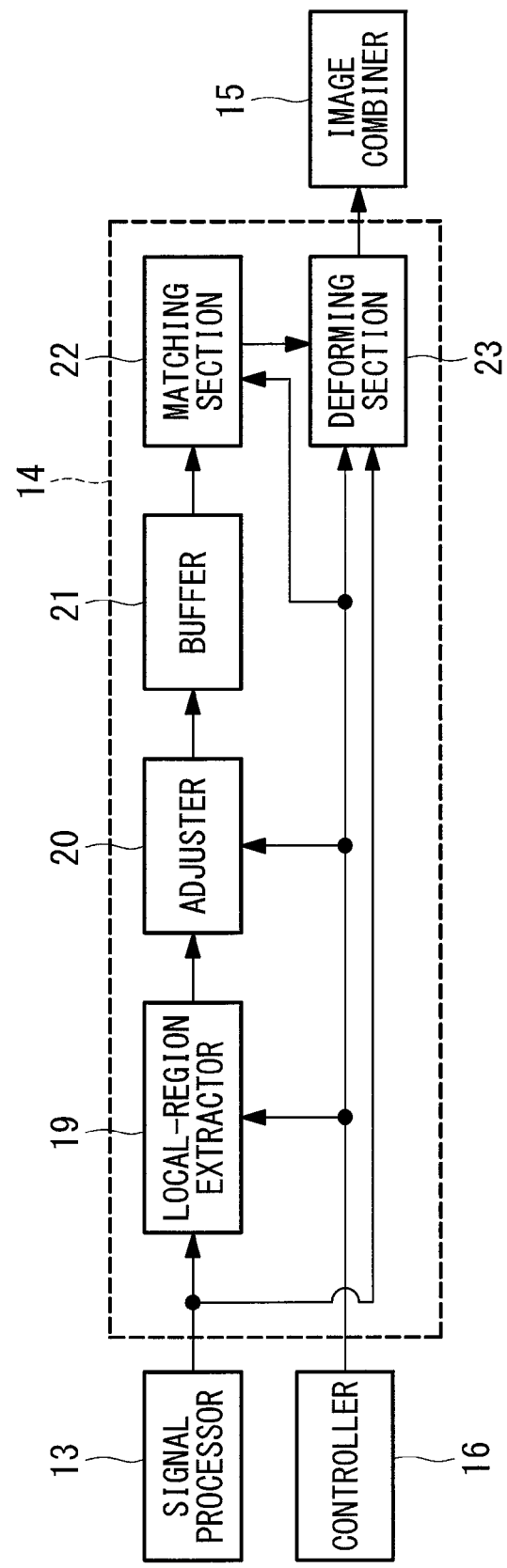
FIG. 5 is a detailed block diagram illustrating a position aligner included in the image acquisition apparatus in FIG. 4.

As shown in FIG. 5, the position aligner 14 includes a local-region extractor (local-region setting section) 19 that extracts a local region from each of the two kinds of image signals generated at the signal processor 13, an adjuster (frequency adjuster) 20 that adjusts a frequency component for each local region extracted at the local-region extractor 19, a buffer 21 that stores the image signals of the local regions for which the frequency components are adjusted at the adjuster 20, a matching section 22 that performs a known matching process on the image signals stored in the buffer 21 for the respective local regions, and a deforming section (image deforming section) 23 that positionally aligns the two image signals by using information about corresponding points calculated in the matching process performed in the matching section 22.

The local-region extractor 19 is configured to extract an image signal of, for example, a 16-by-16 pixel region centered on a reference pixel within each image signal.

Figure 6:
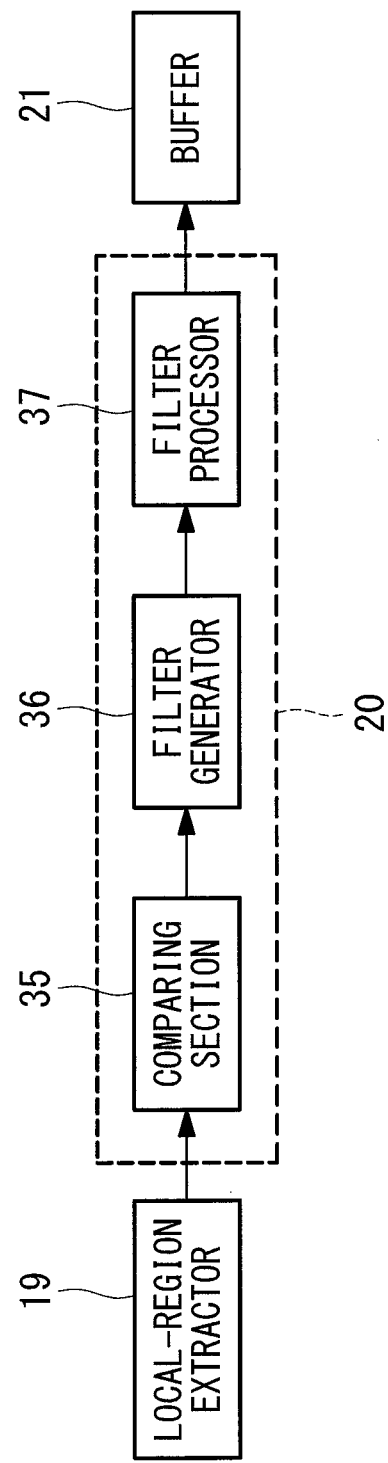
FIG. 6 is a detailed block diagram illustrating an adjuster included in the image acquisition apparatus in FIG. 4.

The adjuster 20 is configured to perform Fourier transformation on each of the local regions of the two image signals so as to calculate a frequency component of each local region. Furthermore, as shown in FIG. 6, the adjuster 20 includes a comparing section 35 that calculates a difference between the calculated frequency components in accordance with formula (1) below.

$$F(u,v)=|G_1(u,v)-G_2(u,v)| \quad (1)$$

In this case, F(u, v) denotes a difference between frequency components at coordinates (u, v) in a frequency space of a local region. Moreover, $G_1(u, v)$ and $G_2(u, v)$ denote frequency components of local regions with respect to the first image signal and the second image signal, respectively.

Based on the difference calculated by the comparing section (difference calculator, determiner) 35, the adjuster 20 performs frequency-characteristic processing in accordance with formula (2) below. For this frequency-characteristic processing, the adjuster 20 may include a filter generator 36 that generates a filter operating in real space, and a filter processor 37 that performs an adjustment process based on the filter generated by the filter generator 36, as shown in FIG. 6.

If $F(u,v) > K, G_1(u,v)=0$ and $G_2(u,v)=0$

If $F(u,v) \leq K, G_1(u,v)=G_1(u,v)$ and $G_2(u,v)=G_2(u,v)$ \quad (2)

In this case, K denotes a predetermined threshold value.

For example, if the first image of a certain subject is in focus whereas the second image is not in focus, there would be a large difference between high-frequency components of local regions, but there would hardly be any difference between intermediate-to-low-frequency components. Therefore, for the high-frequency components with a difference that exceeds the threshold value K, the signal values are set to zero, whereas the signals with the intermediate-to-low-frequency components or lower with a difference that is smaller than or equal to the threshold value K are used as is. Consequently, the positional alignment can be performed with high accuracy in accordance with the intermediate-to-low-frequency components existing commonly in the two image signals.

The adjuster 20 is configured to perform inverse Fourier transformation on the image signals having undergone the above-described adjustment process so as to convert the image signals into image signals in real space.

The buffer 21 is configured to temporarily store the two image signals whose frequency components are adjusted by the adjuster 20.

For each of the local regions of the two image signals stored in the buffer 21, the matching section 22 performs a matching process so as to calculate corresponding points between the two image signals.

In an area, such as a flat area, where there is little texture information, the reliability of the corresponding points is low. Therefore, it is preferable that an edge quantity be extracted from each image signal so that only a corresponding point at coordinates where the edge quantity is larger than a predetermined value is used.

For example, assuming that the coordinates of the corresponding points calculated in the matching process are (x, y) and (x', y'), and the edge quantities are $e_1(x, y)$ and $e_2(x', y')$, only the corresponding points at coordinates that satisfy the conditions $e_1(x, y) > D$ and $e_2(x', y') > D$ are extracted. In this case, D denotes a predetermined threshold value.

The information about the corresponding points extracted at the matching section 22 is transmitted to the deforming section 23.

Figure 7:
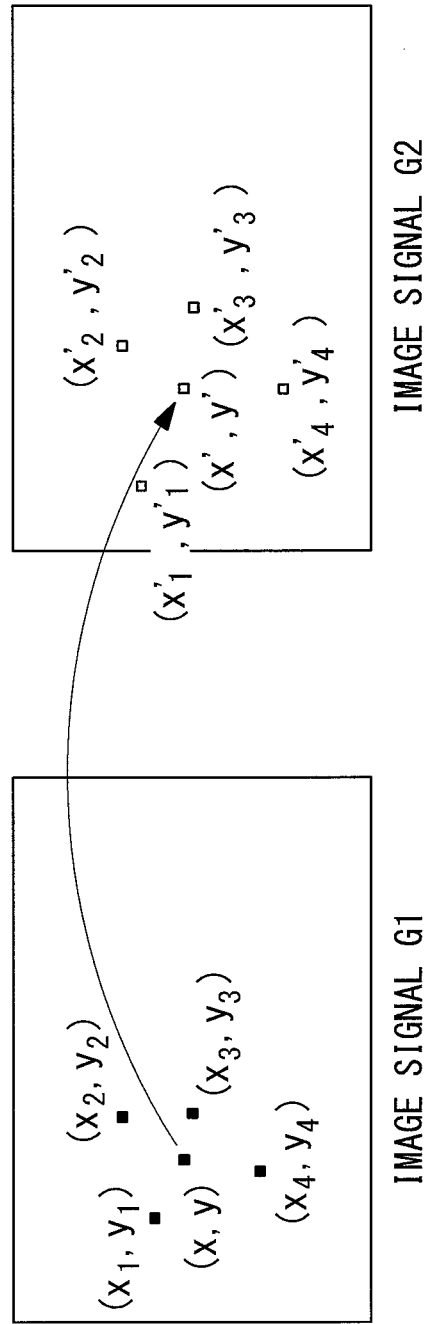
FIG. 7 illustrates a coordinate transformation process performed by a deforming section included in the position aligner in FIG. 5.

As shown in FIG. 7, in the deforming section 23, the coordinates of four points surrounding a reference pixel in a first image signal G1 are $(x_1, Y_1)$, $(x_2, y_2)$, $(x_3, y_3)$, and $(x_4, y_4)$, respectively, and the coordinates of corresponding points of the four points in an image signal G2 are $(x_1', y_1')$, $(x_2', y_2')$, $(x_3', y_3')$, and $(x_4', y_4')$, respectively.

Then, a coordinate transformation matrix as in formula (3) shown in Expression 1 is calculated.

{Expression 1}

$$\begin{bmatrix} x' \\ y' \\ 1 \end{bmatrix} = \begin{bmatrix} a_{11} & a_{12} & a_{13} \\ a_{21} & a_{22} & a_{23} \\ a_{31} & a_{32} & a_{33} \end{bmatrix} \begin{bmatrix} x \\ y \\ 1 \end{bmatrix} \quad (3)$$

In this case, $a_{11}$ to $a_{33}$ each denote a matrix element of a projective transformation and can be uniquely determined by removing the freedom of optical magnification so long as the relationship of the four coordinate transformations can be determined. The optical magnification in this case is set to 1.

Then, the deforming section 23 performs coordinate transformation by applying the coordinate transformation matrix shown in Expression 1 above to the image signal G1 and calculates an image signal G1' positionally aligned with the image signal G2.

Figure 8:
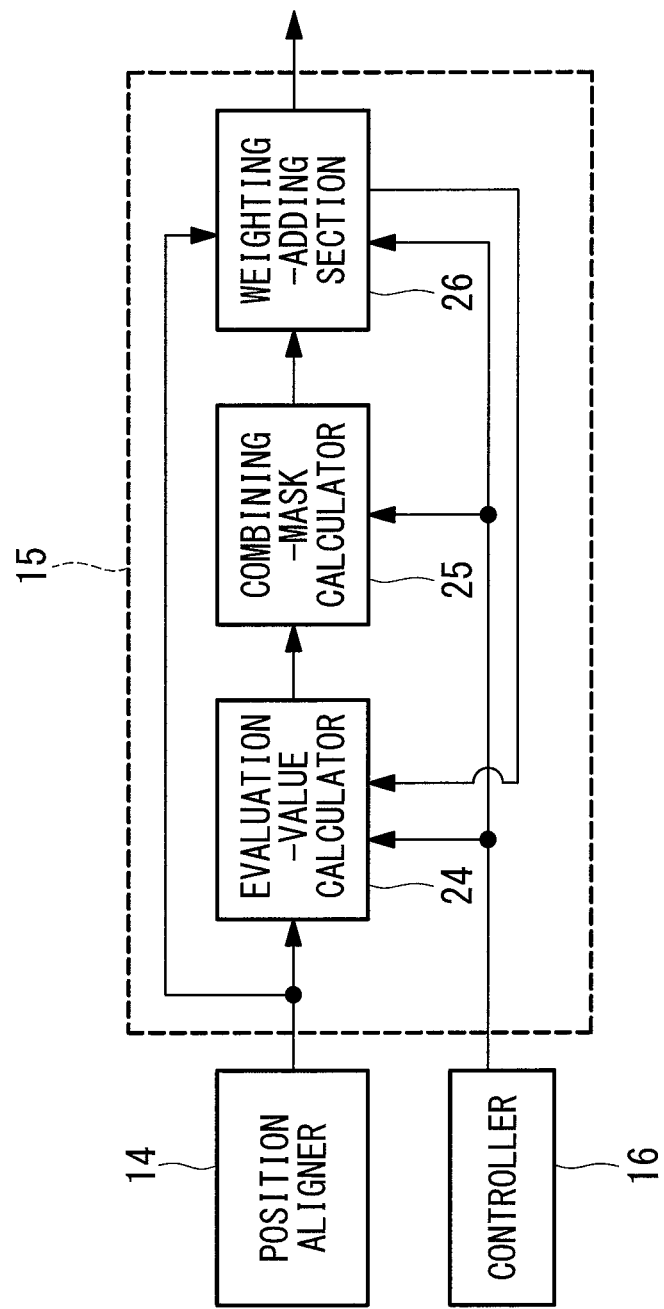
FIG. 8 is a detailed block diagram of an image combiner included in the image acquisition apparatus in FIG. 4.

As shown in FIG. 8, the image combiner 15 includes an evaluation-value calculator 24 that calculates evaluation values from the image signals output from the position aligner 14, a combining-mask calculator (combining-mask generator) 25 that generates a combining mask to be used in a combining process based on the evaluation values calculated by the evaluation-value calculator 24, and a weighting-adding section 26 that combines the two image signals by using the combining mask generated at the combining-mask calculator 25.

As the evaluation values, the evaluation-value calculator 24 is configured to calculate, for example, contrast values $C_{1'}(x, y)$ and $C_2(x, y)$ in the image signal G1' and the image signal G2 in accordance with formula (4) in Expression 2.

{Expression 2}

$$C_{1'}(x, y) = \frac{g_{1'}(x, y \in \omega)_{max} - g_{1'}(x, y \in \omega)_{min}}{g_{1'}(x, y \in \omega)_{max} + g_{1'}(x, y \in \omega)_{min}} \quad (4)$$

In this case, $g_{1'}(x, y \in \Omega)_{max}$ and $g_{1'}(x, y \in \Omega)_{min}$ respectively denote a maximum pixel value and a minimum pixel value in a region $\Omega$ of the first image signal G1', and $g_2(x, y \in \Omega)_{max}$ and $g_2(x, y \in \Omega)_{min}$ respectively denote a maximum pixel value and a minimum pixel value in a region $\Omega$ of the second image signal G2.

The combining-mask calculator 25 is configured to generate a combining mask to be used in the combining process of the two image signals on the basis of the evaluation values calculated at the evaluation-value calculator 24.

In detail, the combining-mask calculator 25 calculates a ratio $E_1(x, y)$ of the contrast values $C_{1'}(x, y)$ and $C_2(x, y)$, which are the evaluation values calculated at the evaluation-value calculator 24, in accordance with formula (5) in Expression 3 and generates each mask value M(x, y) by using the ratio $E_1(x, y)$ in accordance with formula (6) in Expression 4.

{Expression 3}

$$E_1(x, y) = \frac{C_{1'}(x, y)}{C_2(x, y) + \varepsilon} \quad (5)$$

{Expression 4}

$$M_1(x, y) = \begin{cases} 1 & E_1(x, y) \geq J2 \\ 0 & E_1(x, y) \leq J1 \\ \frac{E_1(x, y) - J1}{J2 - J1} & J1 < E_1(x, y) < J2 \end{cases} \quad (6)$$

In this case, $\varepsilon$ denotes a small constant for preventing the denominator of the ratio E(x, y) from being zero and satisfies the condition $\varepsilon > 0$.

Figure 9:
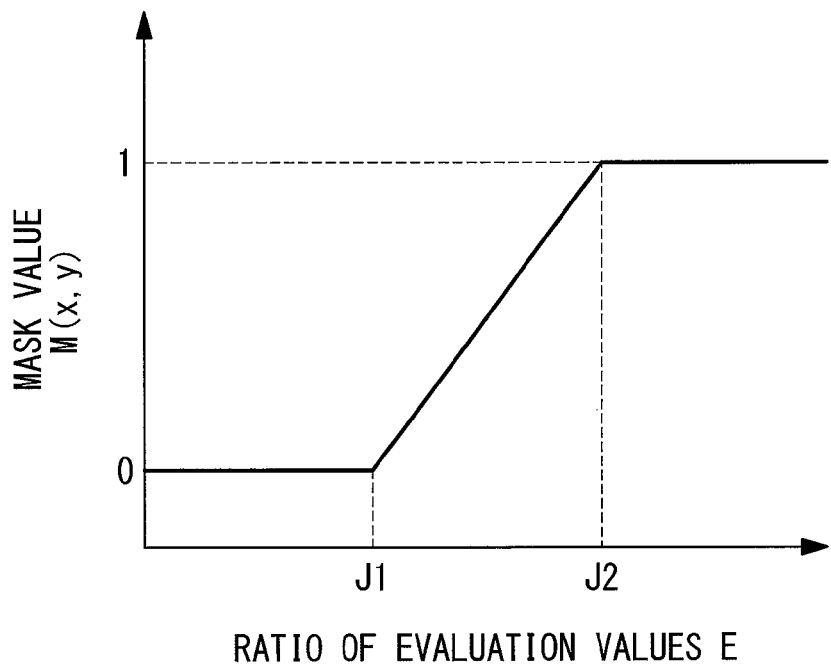
FIG. 9 illustrates an example of a combining mask calculated by a combining-mask calculator included in the image combiner in FIG. 8.

Furthermore, $J_1$ and $J_2$ each denote a predetermined constant ($0 < J_1 < J_2$). When the value of $J_2 - J_1$ is small, the value of M(x, y) becomes closer to a binary value of 0 or 1. FIG. 9 illustrates the mask value M(x, y).

The weighting-adding section 26 performs processing on image signals $g_{1'}(x, y)$ and $g_2(x, y)$ in accordance with formula (7) below by using the combining mask calculated by the combining-mask calculator 25 so as to combine the image signals $g_{1'}(x, y)$ and $g_2(x, y)$, thereby generating a combined image g(x, y).

$$g(x,y) = M(x,y)g_{1'}(x,y) + (1 - M(x,y))g_2(x,y) \quad (7)$$

In the image acquisition apparatus 10 according to this embodiment having the above-described configuration, positional alignment is performed in accordance with frequency components existing commonly in the two image signals $g_1(x, y)$ and $g_2(x, y)$, so that the two image signals $g_1(x, y)$ and $g_2(x, y)$ with different focal positions can be combined with high accuracy. Furthermore, in the image acquisition apparatus 10 according to this embodiment, the two image signals $g_1(x, y)$ and $g_2(x, y)$ are positionally aligned by using a matching process, so that the two image signals $g_1(x, y)$ and $g_2(x, y)$ having parallax can be combined with high accuracy.

As a result, the two simultaneously-acquired image signals $g_1(x, y)$ and $g_2(x, y)$ having parallax and obtained at different focal positions can be combined with high accuracy. This is advantageous in that a stable combined image can be generated even when the subject moves.

Figure 10:
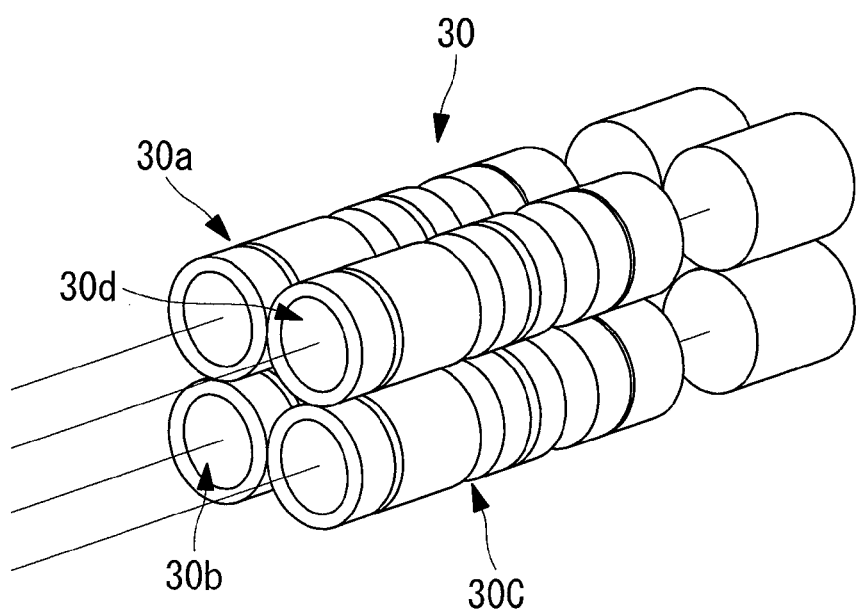
FIG. 10 is a perspective view illustrating a modification of an image-acquisition optical system included in the image acquisition apparatus in FIG. 1.

Although the lenses 4a and 4b disposed at the pupil position of the image-acquisition optical system 2 and the micro-lens array 6 in this embodiment are used for simultaneously forming, on the image acquisition element 5, two subject images having parallax and obtained at different focal positions, an optical system 30 formed of four micro-optical systems 30a to 30d with different focal lengths and arranged in parallel along the optical axis may alternatively be used, as shown in FIG. 10.

Figure 11:
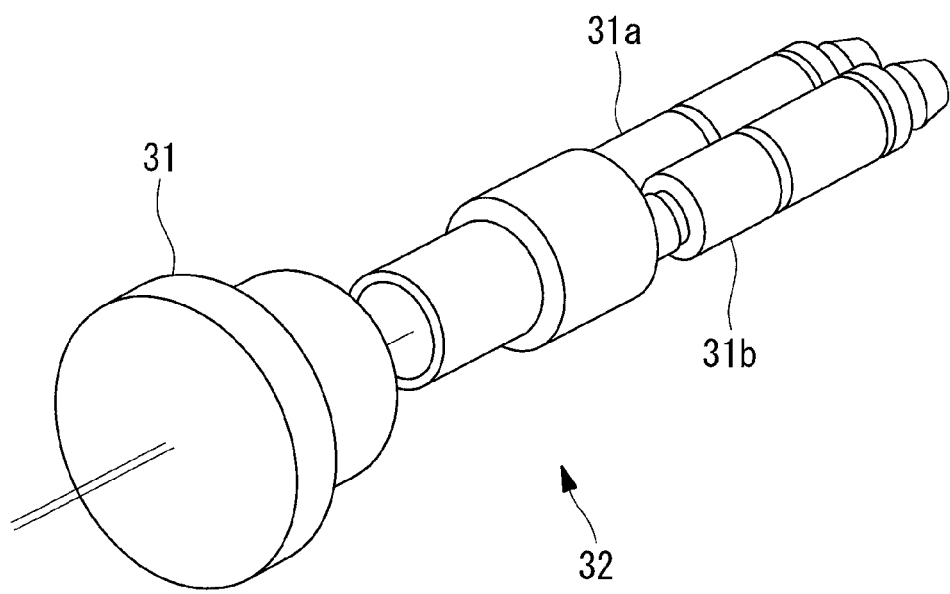
FIG. 11 is a perspective view illustrating another modification of the image-acquisition optical system included in the image acquisition apparatus in FIG. 1.

Furthermore, as shown in FIG. 11, an image-acquisition optical system 32 having two pupil-division optical systems 31a and 31b with different focal lengths may be used. The two pupil-division optical systems 31a and 31b are disposed between an image acquisition lens 31 and the image acquisition element 5 and split and receive light collected by the image acquisition lens 31.

Figure 12:
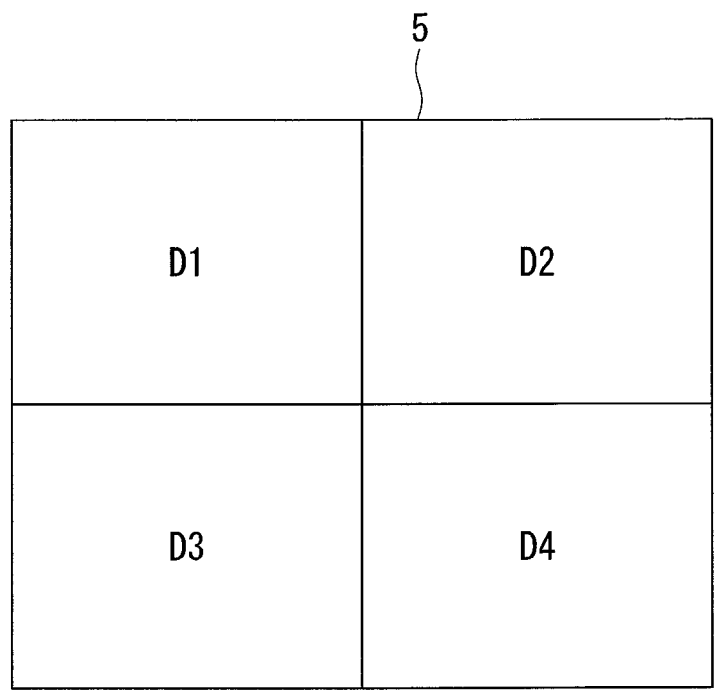
FIG. 12 illustrates an example of image signals acquired by the image-acquisition optical system in FIG. 10.

For example, by using the image-acquisition optical system 30 in FIG. 10, four images D1 to D4 having parallax and obtained at different focal positions with respect to the same subject can be simultaneously formed in areas on the image acquisition element 5 that correspond to the micro-optical systems 30a to 30d, as shown in FIG. 12.

Furthermore, the image acquisition element 5 may be a color CCD equipped with color filters. In this case, if the image signal is an RGB signal, the frequency-component adjustment may be performed by using a G signal or by using Y signal after converting the RGB signal into a YCbCr signal.

Figure 13:
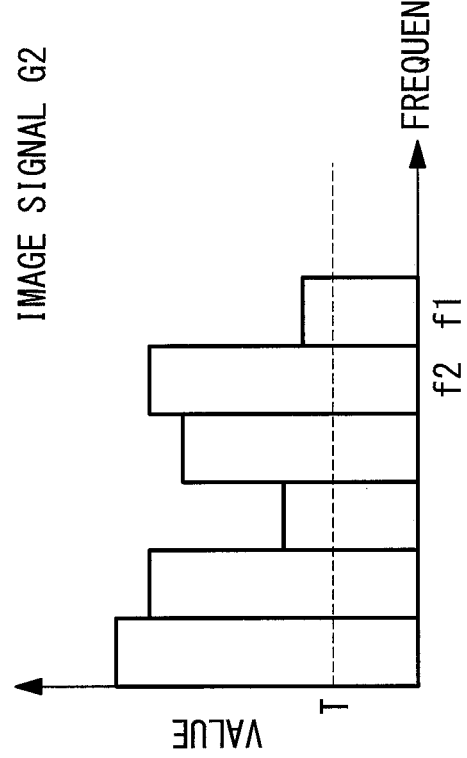
FIG. 13 illustrates a modification of the adjuster included in the position aligner in FIG. 5 and includes part (a) showing a histogram of one image signal and part (b) showing a histogram of another image signal.
Figure 13:
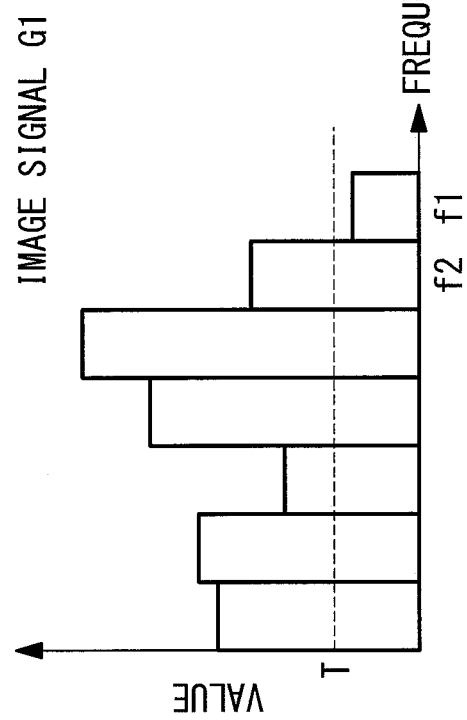

In the above description, if the difference between the frequency components is smaller than the predetermined threshold value, the frequency-component adjustment is performed by using these frequency components. Alternatively, a frequency histogram may be used. FIG. 13 illustrates an example of a frequency histogram. In the drawing, reference character T denotes a predetermined threshold value. In each of the image signals G1 and G2, the high frequency component thereof may sometimes contain a noise signal due to, for example, the effect of noise.

Therefore, in the frequency histogram of the first image signal G1 shown in FIG. 13(a), a frequency $f_1$ having a value that is lower than or equal to the threshold value T can be regarded as a noise component, and a frequency $f_2$ can be regarded as an effective maximum frequency component. In the frequency histogram of the second image signal G2 shown in FIG. 13(b), a frequency $f_2$ is selected as a common frequency component if the frequency $f_2$ is an effective maximum frequency component.

Figure 14:
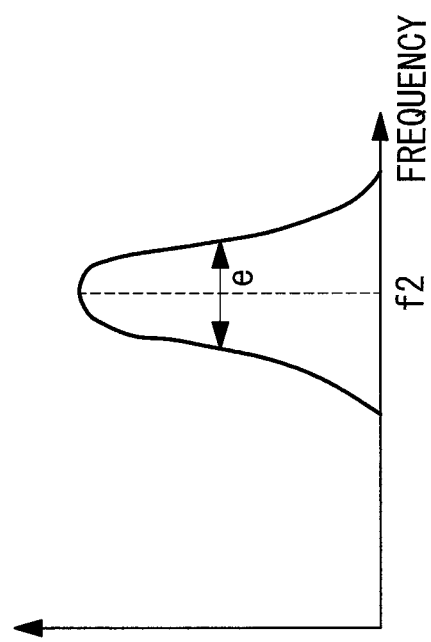
FIG. 14 illustrates two examples of frequency bands used when the adjuster in FIG. 13 performs frequency conversion.
Figure 14:
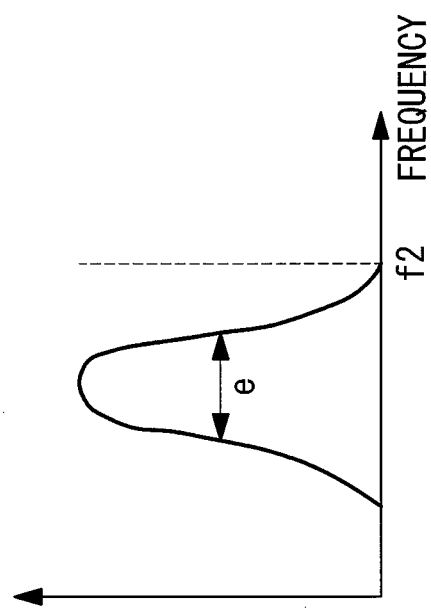

For example, a frequency band in which frequency conversion is to be performed is set so as not to exceed the selected frequency $f_2$, as shown in FIG. 14(a), or is set to a predetermined range (e.g., half-width e) centered on the frequency $f_2$, as shown in FIG. 14(b). After suppressing frequency components outside the set band, inverse Fourier transformation may be performed so as to convert the image signals into image signals in real space.

A search range for the matching process may be arbitrarily set by the user or may be set in proportion to the distance between the optical axes of the multiple pupil-division optical systems 31a and 31b.

Furthermore, although the evaluation-value calculator 24 is configured to calculate the contrast values $C_1(x, y)$ and $C_2(x, y)$ as evaluation values in this embodiment, the evaluation-value calculator 24 may alternatively calculate the sharpness S.

The sharpness S can be calculated in accordance with formula (8) in Expression 5.

{Expression 5}

$$S_1(x, y) = \sum_{\xi,\eta} g_n(\xi, \eta) f(x - \xi, y - \eta) \qquad (8)$$

Furthermore, although the combining-mask calculator 25 is configured to calculate the mask value M(x, y) based on the ratio of the evaluation values in the above embodiment, the combining-mask calculator 25 may alternatively calculate the mask value M(x, y) based on a difference between the evaluation values, as shown in formula (9) below:

$$E(x,y) = C_1(x,y) - C_2(x,y) \qquad (9)$$

Furthermore, although the weighting-adding section 26 performs a combining process by assigning weights to the image signals $g_1(x, y)$ and $g_2(x, y)$ by using the mask value M(x, y), the weighting-adding section 26 may use one of the image signals $g_1(x, y)$ and $g_2(x, y)$ without using a weighting coefficient.

Furthermore, although the above description relates to a case where two image signals are acquired and combined, three or more image signals may be combined. In this case, a process of combining one of the image signals with two image signals and then combining the combined image signal with another pre-combined image signal may be repeated.

REFERENCE SIGNS LIST 1, 10 image acquisition apparatus
2, 30, 32 image-acquisition optical system
4 focal-length changing section
5 image acquisition element
5a, 5b pixel
6 micro-lens array
6a micro-lens
13 signal processor (image generator)
14 position aligner
15 image combiner
19 local-region extractor (local-region setting section)
20 adjuster (frequency adjuster)
22 matching section
23 deforming section (image deforming section)
24 evaluation-value calculator
25 combining-mask calculator (combining-mask generator)
26 weighting-adding section (adding section)
30a to 30d micro-optical system
31 image acquisition lens
31a, 31b pupil-division optical system
35 comparing section, difference calculator, determiner
37 filter processor

The invention claimed is:

1. An image acquisition apparatus comprising:
an image-acquisition optical system that includes at least one lens and that collects light from a subject;
an image acquisition element that includes an image sensor and that acquires an image of the light collected by the image-acquisition optical system;
a micro-lens array having an array of multiple micro-lenses arranged such that each micro-lens covers multiple pixels of the image acquisition element; and
a focal-length changing section that includes a plurality of lenses, that is disposed at a pupil position of the image-acquisition optical system, that divides the pupil position into a plurality of areas, and that changes, for each of the plurality of areas, a focal length so as to focus light passing therethrough at a plurality of different focal positions,
wherein the image-acquisition optical system includes a plurality of lenses that are disposed along an optical axis of the image-acquisition optical system,
wherein the plurality of areas are arranged in a direction perpendicular to the optical axis of the image-acquisition optical system and have powers different from each other, and
wherein one of the plurality of lenses of the image-acquisition optical system disposed at a subject side and another one of the plurality of lenses of the image acquisition optical system disposed at an image side are in common with respect to the light passing through the plurality of areas.

2. The image acquisition apparatus according to claim 1, further comprising a processor which is configured to operate as:
an image generator that extracts signals from pixels receiving light beams of a common focal length for each of the micro-lenses so as to generate a plurality of image signals,
a position aligner that positionally aligns the plurality of image signals generated by the image generator, and an image combiner that generates a combined image by combining the plurality of image signals positionally aligned relatively to each other by the position aligner.

3. The image acquisition apparatus according to claim 2, wherein the image combiner includes:
   an evaluation-value calculator that calculates, for each pixel, an evaluation value required for determining whether the plurality of image signals are in focus,
   a combining-mask generator that generates a combining mask for combining the image signals by using the evaluation values calculated by the evaluation-value calculator, and
   an adding section that performs a weighting-adding process on the plurality of image signals on a pixel-by-pixel basis by using the combining mask generated by the combining-mask generator.

4. The image acquisition apparatus according to claim 1, wherein one of the plurality of lenses of the image-acquisition optical system which is disposed closest to the subject side has a negative power.

5. An image acquisition apparatus comprising:
   an image-acquisition optical system that includes at least one lens and that collects light from a subject;
   an image acquisition element that includes an image sensor and that acquires an image of the light collected by the image-acquisition optical system;
   a micro-lens array having an array of multiple micro-lenses arranged such that each micro-lens covers multiple pixels of the image acquisition element;
   a focal-length changing section that includes a plurality of lenses, that is disposed at a pupil position of the image-acquisition optical system and that spatially changes a focal length so as to focus light passing therethrough at a plurality of different focal positions; and
   a processor which is configured to operate as:
      an image generator that extracts signals from pixels receiving light beams of a common focal length for each of the micro-lenses so as to generate a plurality of image signals,
      a position aligner that positionally aligns the plurality of image signals generated by the image generator,
      an image combiner that generates a combined image by combining the plurality of image signals positionally aligned relatively to each other by the position aligner,
   wherein the position aligner includes:
      a local-region setting section that sets a local region formed of multiple pixels centered on a reference pixel for each of the plurality of image signals,
      a frequency adjuster that adjusts frequency components of the local regions set for the respective image signals by the local-region setting section to a common frequency component,
      a matching section that performs a matching process between the local regions of the image signals whose frequency components have been adjusted by the frequency adjuster, and
      an image deforming section that deforms the plurality of image signals based on a result of the matching process performed by the matching section.

6. The image acquisition apparatus according to claim 5, wherein the frequency adjuster includes:
   a comparing section that compares the frequency components of the local regions corresponding to the plurality of image signals, and
   a filter processor that applies a filter generated based on a comparison result obtained by the comparing section to the local regions corresponding to the plurality of image signals.

7. The image acquisition apparatus according to claim 5, wherein the position aligner sets a search range for the local regions corresponding to the plurality of image signals in accordance with a distance from an optical axis of the image-acquisition optical system, and
   wherein the matching section searches for the local regions based on the search range set by the position aligner and performs the matching process by using the searched local regions.

8. The image acquisition apparatus according to claim 6, wherein the comparing section calculates a difference between the frequency components of the local regions corresponding to the plurality of image signals, and determines whether or not the calculated difference is larger than a predetermined threshold value, and
   wherein the filter processor generates the filter used for only extracting frequency components whose difference therebetween is determined as being smaller than or equal to the threshold value.

9. The image acquisition apparatus according to claim 5, wherein the frequency adjuster:
   calculates a histogram for the frequency components of the local regions corresponding to the plurality of image signals,
   generates a filter based on the calculated histogram, and
   applies the generated filter to the local regions corresponding to the plurality of image signals.

10. An image acquisition apparatus comprising:
    an image acquisition element that includes an image sensor and that acquires an image of light from a subject;
    an image-acquisition optical system that includes at least one lens and that causes light beams that form images having parallax and obtained at different focal positions to be incident on different areas of the image acquisition element; and
    a processor which is configured to operate as:
       a position aligner that positionally aligns a plurality of image signals acquired at the different areas of the image acquisition element, and
       an image combiner that generates a combined image by combining the plurality of image signals positionally aligned relatively to each other by the position aligner,
    wherein the position aligner includes:
       a local-region setting section that sets a local region formed of multiple pixels centered on a reference pixel for each of the plurality of image signals,
       a frequency adjuster that adjusts frequency components of the local regions set for the respective image signals by the local-region setting section to a common frequency component,
       a matching section that performs a matching process between the local regions of the image signals whose frequency components have been adjusted by the frequency adjuster, and
       an image deforming section that deforms the plurality of image signals based on a result of the matching process performed by the matching section.

11. The image acquisition apparatus according to claim 10, wherein the image combiner includes:

an evaluation-value calculator that calculates, for each pixel, an evaluation value required for determining whether the plurality of image signals are in focus, a combining-mask generator that generates a combining mask for combining the image signals by using the evaluation values calculated by the evaluation-value calculator, and an adding section that performs a weighting-adding process on the plurality of image signals on a pixel-by-pixel basis by using the combining mask generated by the combining-mask generator.

12. The image acquisition apparatus according to claim 10, wherein the frequency adjuster includes:

a comparing section that compares the frequency components of the local regions corresponding to the plurality of image signals, and a filter processor that applies a filter generated based on a comparison result obtained by the comparing section to the local regions corresponding to the plurality of image signals.

13. The image acquisition apparatus according to claim 10, wherein the position aligner sets a search range for the local regions corresponding to the plurality of image signals in accordance with a distance from an optical axis of the image-acquisition optical system, and wherein the matching section searches for the local regions based on the search range set by the position aligner and performs the matching process by using the searched local regions.

14. The image acquisition apparatus according to claim 12, wherein the comparing section calculates a difference between the frequency components of the local regions corresponding to the plurality of image signals, and determines whether or not the calculated difference is larger than a predetermined threshold value, and wherein the filter processor generates the filter used for only extracting frequency components whose difference therebetween is determined as being smaller than or equal to the threshold value.

15. The image acquisition apparatus according to claim 10, wherein the frequency adjuster:

calculates a histogram for the frequency components of the local regions corresponding to the plurality of image signals, generates a filter based on the calculated histogram, and applies the generated filter to the local regions corresponding to the plurality of image signals.

16. The image acquisition apparatus according to claim 10, wherein the image-acquisition optical system includes an image acquisition lens that collects the light from the subject, and two or more pupil-division optical systems having different focal lengths, wherein the two or more pupil-division optical systems are disposed between the image acquisition lens and the image acquisition element and split and receive the light collected by the image acquisition lens.

* * * * *